United States Patent [19]

Leyden et al.

[11] Patent Number: 4,781,942
[45] Date of Patent: Nov. 1, 1988

[54] PROCESS FOR THE PHOTOCHEMICAL VAPOR DEPOSITION OF SILOXANE POLYMERS

[75] Inventors: Richard N. Leyden, Topanga; James T. Hall, Torrance, both of Calif.

[73] Assignee: Hughes Aircraft Company, Los Angeles, Calif.

[21] Appl. No.: 810,810

[22] Filed: Dec. 19, 1985

[51] Int. Cl.$^4$ .................. B05D 3/06; C08G 77/12
[52] U.S. Cl. .................. 427/54.1; 522/172; 522/914; 528/31; 556/487; 428/447
[58] Field of Search .......... 522/172; 556/487; 528/31; 427/54.1

[56] References Cited

U.S. PATENT DOCUMENTS

| | | | |
|---|---|---|---|
| 3,119,707 | 1/1984 | Christy | 522/172 |
| 3,271,180 | 9/1966 | White | 427/99 |
| 3,310,424 | 3/1967 | Wehner | 427/54.1 |
| 3,822,928 | 7/1974 | Smolinsky | 522/172 |
| 4,096,315 | 6/1978 | Kubacki | 428/412 |
| 4,137,365 | 1/1979 | Wydeven | 428/412 |
| 4,163,072 | 7/1979 | Soos | 427/96 |
| 4,364,809 | 12/1982 | Sato | 525/925 |
| 4,371,587 | 2/1983 | Peters | 427/54.1 |
| 4,397,722 | 8/1983 | Haller | 522/172 |
| 4,597,986 | 7/1986 | Scapple | 427/53.1 |

OTHER PUBLICATIONS

"-Photo-Reactions of Silane and Methylsilane-", Kamaratos et al, The Journal of Physical Chemistry, 74, No. 11, 1970, pp. 2267–2274.
Eaborn, "Organosilicon Compounds", Academic Press, 1960, p. 227.
Chemical Abstracts, vol. 94, No. 24, Abst. 193755x, Szeto.
Chen, Chemical Abstracts, vol. 97, No. 26, Abst. 217205h.
Nippon, Chemical Abstracts, vol. 100, Abst. 176536b.
Inagaki, Chemical Abstracts, vol. 102, Abst. 7518h, Jan. 14, 1985.

Primary Examiner—John C. Bleutge
Assistant Examiner—Arthur H. Koeckert
Attorney, Agent, or Firm—Mary E. Lachman; A. W. Karambelas

[57] ABSTRACT

A process for forming on the surface of a substrate a layer of a siloxane polymer by exposing the substrate to a first vapor phase monomer precursor having the formula $SiR_xH_{4-x}$ where x is 1 to 4 and R is alkyl or phenyl, and a second vapor phase oxygen-containing precursor in the presence of radiation of a predetermined wavelength to bring about the reaction to form the siloxane polymer which deposits on the surface of substrate. The monomer precursor may comprise a mixture, such as $SiRH_3$ and $SiR_2H_2$ with each other or with $SiR_3H$. By varying the composition of such mixtures, the composition of the siloxane polymer may be chosen to provide predetermined properties, and, further, may be varied throughout the thickness of the deposited layer.

12 Claims, No Drawings

PROCESS FOR THE PHOTOCHEMICAL VAPOR DEPOSITION OF SILOXANE POLYMERS

BACKGROUND OF THE INVENTION

1. Field of the Invention

The present invention relates generally to a process for forming siloxane polymers and, more particularly, to a photochemical vapor deposition process for depositing layers of such polymers on a substrate.

2. Description of the Related Art

Dielectric or insulating materials such as silicon dioxide and silicon nitride are widely used in the fabrication of semiconductor devices and circuits to provide a layer of electrical insulation which prevents contact or unwanted current flow between adjacent conductive areas or materials. In addition, such insulating materials are used as a surface passivation layer to protect the surface of the substrate or as a mask during such procedures as etching or ion implantation. Such layers have typically been formed by thermal chemical vapor deposition at elevated temperatures, by plasma-enhanced chemical vapor deposition, or by reactive sputtering or nonreactive sputtering techniques. However, the latter three processes have the disadvantage of producing charge bombardment or radiation bombardment of the substrate and consequent degradation of device performance, while the thermal process produces thermal damage to the substrate. A recently developed process for oxide deposition which overcomes these disadvantages is the photochemical vapor deposition process described in U.S. Pat. No. 4,371,587, assigned to the present assignee. Similar photochemical processes for depositing nitride layers and sulfide layers are described in U.S. Pat. Nos. 4,181,751 and 4,447,469 respectively, both assigned to the present assignee.

As an alternative to oxide or nitride passivation layers, certain polymers have been used for this purpose. One such polymer is Parylene (a para-xylylene available from Union Carbide) which has been produced by vapor phase deposition and polymerization on the surface of the substrate. However, there is sometimes a problem with achieving good adhesion of the Parylene to the substrate. In other cases, it is sometimes difficult to remove the Parylene layer for repair of the underlying device.

Another polymer which is useful as a passivation layer for microelectronic devices and circuits is a silicone or polymer of siloxane compounds of the formula $R_2SiO$, when R is an alkyl group. A known method for forming a polysiloxane encapsulant is described, for example, in U.S. Pat. No. 4,163,072 to Soos and comprises applying a coating of an uncured room temperature vulcanizing (RTV) silicone on the substrate and exposing the RTV silicone to moisture at a temperature of 90°–130° C. and for a time (e.g. 1 to 24 hours) sufficient to cure the silicone.

While the above-noted polymers have been useful for some purposes, the need exists for a process for depositing an adhesive layer of a siloxane protective polymer on a substrate in the fabrication of semiconductor devices and circuits or other structures in such a manner that the properties of the siloxane polymer layer can be tailored to meet particular requirements.

SUMMARY OF THE INVENTION

The general purpose of the present invention is to provide a new and improved process for depositing a layer of a siloxane polymer on the surface of a substrate by a low-temperature photochemical vapor deposition process. This process possesses most, if not all, of the advantages of the prior art processes, while possessing yet additional advantages, as well as overcoming some disadvantages of the prior art processes.

The above-described general purpose of this invention is accomplished by exposing the substrate to a first vapor phase reactant comprising the monomer precursor having the formula $SiR_xH_{4-x}$ where x is 1 to 4 and R is alkyl or phenyl, and a second vapor phase reactant comprising a chosen oxygen-containing precursor in the presence of radiation of a predetermined wavelength. Upon radiation inducement, the vapor phase reactants interact to form a siloxane polymer which deposits as a layer on the surface of the substrate.

Accordingly, it is a specific purpose of the present invention to provide a polysiloxane protective layer on a substrate in which the physical properties of the layer may be predetermined to be within the range from a tacky rubber to a hard glass consistency and to possess predetermined solubility properties.

Another purpose of the present invention is to provide a protective layer of the type described in which the composition of the layer may be varied throughout the thickness of the layer.

Yet another purpose is to provide a layer of the type described above which has good adhesion to the substrate.

Another purpose of the present invention is to provide a low-temperature process for depositing a polysiloxane layer on a substrate without producing thermal damage to the substrate.

Still another purpose of the present invention is to provide a process for depositing a protective layer of the type described above on predetermined portions of the substrate.

The above discussed and many other features and attendant advantages of the present invention will become better understood by reference to the following detailed description of the invention.

DETAILED DESCRIPTION OF THE INVENTION

In accordance with a first embodiment of the present invention, a layer of a polysiloxane is formed on the surface of the substrate by a vapor phase photochemical reaction between an oxygen-containing compound and a selected monomer precursor having the formula $SiR_xH_{4-x}$ where x is 1 to 4 and R is an alkyl group, such as a C1–C4 alkyl, or phenyl, which may be substituted or unsubstituted. R is selected so that the monomer is in the vapor phase or readily converted to the vapor phase. Where R is a phenyl group, the latter may be substituted with an aprotic radical which is unreactive with the Si-H radical, such as an alkyl or halogen radical. In addition, the monomer precursor may comprise a mixture of the above-noted monomers.

More particularly, in accordance with a specific embodiment of the present invention, a substrate, such as a microelectronic integrated circuit or hybrid, is exposed to phenyl silane vapor and nitrous oxide, and radiation having a wavelength of 1849 Å, such as from a low pressure mercury vapor lamp. As is known in the art of photochemical vapor deposition and discussed in U.S. Pat. No. 4,371,587, radiation within the range 1750 to 1950 Å causes the direct dissociation of nitrous oxide to form atomic oxygen and nitrogen as indicated in Equation (1) below. The atomic oxygen interacts with the monomer precursor to produce the siloxane polymer as indicated in Equations (2), (3) and (4) below.

$$N_2O + hc/\lambda(1849 \text{ Å}) \rightarrow O + N_2 \quad (1)$$

where
- h = Planck's constant
- c = speed of light
- λ = wavelength of absorbed radiation It should be noted with regard to the oxidation of the monomer precursor that the Si-R bond is less reactive toward atomic oxygen than the Si-H bond and consequently, the former tends to remain intact, while the latter tends to be oxidized.

The monomer precursor may be substituted with one to four organic groups. Where a mono-substituted monomer, such as methylsilane, is used, the resulting polymer coating will be a highly crosslinked glass material as generally indicated in Equation (2) below.

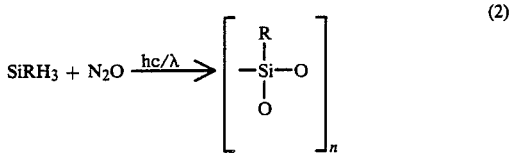

where n = degree of polymerization
= crosslink to another polymer chain

When a di-substituted monomer is used, the polymer coating is a linear polymer as indicated in Equation (3) below, which behaves as a rubber at sufficiently high degree of polymerization.

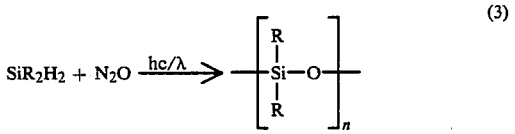

If the polymer so formed has a relatively low molecular weight, the polymer coating might not possess sufficient hardness. This problem can be corrected by mixing a mono-substituted monomer, such as ethylsilane, with the di-substituted monomer to produce crosslinking and improved hardness.

When a tri-substituted monomer is used, the product formed depends on the mechanism by which the reaction occurs. If one R-Si bond in SiR₃H is broken by photolysis or by reaction with the atomic oxygen, the product of the present process would have the structure indicated in Equation (3) above for the product. Alternatively, when a tri-substituted monomer is used, one hydrogen atom may be removed from the R group by photolysis or by reaction with atomic oxygen to form an R radical; and the product formed by the present process would be similar to the product indicated in Equation (3) above except that the silicon atom would be attached to an R radical. The latter product is not a pure polysiloxane, but rather a polysiloxane ether. The mechanism for forming polysiloxane from SiR₃H in accordance with the present invention has not been determined and the previous discussion with regard to such mechanisms is not intended to limit the present invention in any way.

A monomer of the formula SiR₄ may also be used in practising the process of the present invention. The reaction mechanisms are the same as those discussed above for a SiR₃H precursor. Two R-Si bonds may be completely severed in the present process to produce a product as indicated in Equation (3). Alternatively, one R-Si bond may be severed and one R radical may be formed in the present process to form the polysiloxane ether described above.

It is likely that the most useful coatings can be obtained from a mixture of the above discussed monomers to form copolymers. For example, a tri-substituted monomer may be mixed with a mono-substituted monomer to produce a copolymer coating with less crosslinking and improved toughness, as indicated in Equation (4) below.

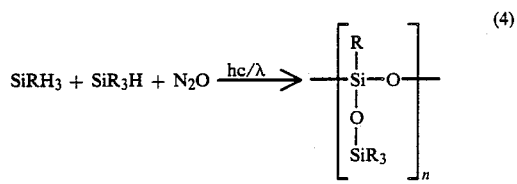

The mixtures may be chosen so that the coating is customized to have any of a wide spectrum of physical properties from a tacky rubber to a flexible rubber to a hard glass. In addition, by appropriate choice of the monomer mixture, the coating formed by the present process may be customized to be either resistant or non-resistant to a particular solvent. While solvent resistance is desirable for a protective coating, in some cases where the protective coating must be removed in order to repair the underlying device or circuit, it is desirable that the coating be soluble in a particular solvent. By appropriate choice of the extent of crosslinking in the polymer and the side chain or pendant groups from the monomer, the polymers formed in accordance with the process of the present invention may be customized with respect to desired solubility properties. For example, a phenyl group in the monomer or a high degree of crosslinking in the polymer generally enhances the resistance of the polymer to solvents.

Moreover, the composition of the mixture can be dynamically changed during the deposition process so that the composition of the deposited layer changes in a continuous manner throughout the thickness of the layer. The composition of the initial material deposited is chosen to be strongly adherent to the substrate and to provide a good match in thermal expansion coefficient with the substrate. Subsequent material deposited is chosen to provide a particular desired property, such as a sticky outer surface to serve as a particle trap to attract dirt or metal chips that could otherwise cause an electrical short circuit upon contact with a conductor in an integrated circuit. For example, the process can begin with the deposition of a layer of silicon dioxide from silane and nitrous oxide by exposure to radiation at 1849 Å as described in U.S. Pat. No. 4,371,587. Then, the selected mono-substituted or di-substituted organosilane monomer is added in increasing proportions while the proportion of silane is decreased. The relative proportions of reactants are controlled as a function of time by controlling the flow rates of the vapor phase reactants with flow controllers or flow meters. The process can readily be computer controlled to be highly reproducible. Since the composition of the deposited material changes gradually, there are no distinct layers which may subsequently separate, as is sometimes encountered in other known methods for forming passivation layers. Moreover, by the above-described process, the dielectric oxide may be deposited on a substrate, and then the polysiloxane passivation layer may be deposited thereon in a continuous manner in the same deposition chamber.

The atomic oxygen required for the above-discussed reaction may alternatively be formed by the direct photochemical dissociation of molecular oxygen or nitrogen dioxide (N02), as shown in Equations (5) and (6), or of similar known materials which are capable of dissociation to oxygen by a direct photochemical process.

$$O_2 + hc/\lambda(1849 \text{ Å}) \rightarrow 2O \quad (5)$$

$$NO_2 + hc/\lambda(3500-6000 \text{ Å}) \rightarrow O + NO \quad (6)$$

When molecular oxygen is used as the source of atomic oxygen, the operating pressure and reactant gas ratio must be carefully controlled in order to inhibit the spontaneous thermal oxidation of the organosilane monomer by the oxygen.

As yet another alternative, the atomic oxygen required in the process of the present invention may be formed by a mercury-photosensitized reaction as described in U.S. Pat. No. 4,371,587. In accordance with such a process, mercury vapor is mixed with the vapor phase reactants and is introduced into the deposition chamber. Radiation having a wavelength of 2537 Å, such as from a low pressure mercury vapor lamp, is introduced into the chamber, where the radiation is absorbed by the mercury vapor to form mercury in an excited state (Hg*), as shown in Equation (7) below. The Hg* then interacts with and transfers energy to the nitrous oxide (N2O) and causes the dissociation thereof to form atomic oxygen, as shown in Equation (8) below.

$$Hg + hc/\lambda(2537 \text{ Å}) \rightarrow Hg^* \quad (7)$$

$$Hg^* + N_2O \rightarrow O + N_2 + Hg \quad (8)$$

The required atomic oxygen may optionally be formed by the mercury-photosensitized dissociation of molecular oxygen or nitrogen dioxide. In addition, in place of mercury, other photosensitizers, such as cadmium, zinc, or xenon, may be used with radiation having a wavelength corresponding to the absorption wavelength for that element. Moreover, a medium pressure mercury vapor lamp may be used to provide a higher intensity output than a low pressure lamp and would be useful in conjunction with sensitizers other than mercury or for direct photolysis.

An apparatus suitable for carrying out the above-described process of the present invention is set forth in U.S. Pat. No. 4,371,587, the details of which are incorporated herein by reference. Vapor phase reactants are introduced into the reaction chamber through the control of flow meters to provide predetermined amount of reactants. In practice, flow rates of about 0-50 standard cubic centimeters per minute (sccm) are used for the nitrous oxide and flow rates from about 5 to about 40 sccm are used for the monomer precursor. The flow rate of the oxygen-containing compound is adjusted, depending on the reactivity of the compound. For example, the flow rate of oxygen is lower than that of nitrous oxide specified herein since the former is more reactive toward ultraviolet radiation than the latter.

Since the process of the present invention is photo-initiated, no heat is required to induce the reaction to form the siloxane polymer. In some cases, it might be advantageous to heat the substrate, for example, to a temperature of 100° C., in order to improve the morphology of the deposited material. However, it must be noted that deposition rates are lower at higher temperatures. The process of the present invention may be performed at a temperature as low as room temperature (30° C.) or as high as (200° C.) or higher.

The operating pressure in the photochemical vapor deposition chamber for the process of the present invention is typically within the range of about 0.1 to about 5 torr (about 10 to 700 Pascals), although higher or lower pressures may be used if required. The length of time required to deposit a polysiloxane layer in accordance with the present invention depends on, among other things, the layer thickness and the deposition rate and may vary from about 5 to 180 minutes. The rate of deposition is dependent on the temperature of the substrate, the intensity of the reaction-inducing radiation, the concentration of reactants, and the flow rates of the reactants.

The substrate for the process of the present invention may be an integrated circuit, a hybrid circuit, a printed wiring board, or a flexible cable. Alternatively, the substrate for the present process may be an optical element such as a glass or plastic lens or slide.

If desired, the polysiloxane formed by the process of the present invention may be deposited on predetermined portions of the substrate by using a mask to prevent radiation from striking the portions of the substrate where deposition is not desired.

Thus, in accordance with the process of the present invention, there is provided a polysiloxane layer as an adherent conformal coating with good dielectric properties, which is useful as the final protective coating on microelectronic integrated circuits hybrids, and printed circuit boards, as well various other substrates. In addition, by the process of the present invention, the composition of the polysiloxane layer may be tailored to have particular properties. Moreover, the composition of the polysiloxane layer formed in accordance with the process of the present invention may be varied in a predetermined manner throughout the thickness of the polysiloxane layer. In addition, the polysiloxane layer is provided in accordance with the process of the present invention by a low-temperature process (e.g. 30° to 200° C.) which avoids and minimizes thermal damage to the substrate, and makes this process particularly well suited for applying a protective layer to a temperature-sensitive substrate, such as a low-melting metal, a temperature-sensitive compound semiconductor material, a temperature-sensitive plastic material, or a semiconductor device substrate having predefined dopant regions. Further, the photochemical vapor deposition process of the present invention avoids charge damage and radiation damage to the substrate and thus provides enhanced device performance as discussed in U.S. Pat. No. 4,371,587. Finally, the polysiloxane layers formed in accordance with the process of the present invention can be customized to be resistant or non-resistant to particular solvents, which makes them well suited for use as protective coatings or corrosion resistant coatings for microelectronic components and other substrates.

EXAMPLE 1

This examples illustrates the formation of a polysiloxane layer in accordance with the process of the present invention as previously described in detail. A known photochemical vapor deposition system as generally described in U.S. Pat. No. 4,371,587 was used. The substrate was a 1 inch by 3 inch (2.54cm by 7.62cm) wafer of silicon and the temperature of the substrate was 100° C. The oxygen-containing precursor was nitrous oxide, and the predetermined wavelength of radiation was 1849 Å. Twenty milliliters (ml) of phenylsilane monomer was placed in a stainless steel cylinder and attached to an inlet to the photochemical vapor deposition chamber. The monomer was degassed by applying vacuum and refilling with nitrogen several times. The partial pressure of the phenylsilane monomer at full pumping was 120 millitorr (16 pascals). The partial pressure of the nitrous oxide at full pumping was 130 millitorr (17 pascals). Operating pressure in the deposition chamber with partial pumping during deposition was 2 torr (266 pascals). The deposition was conducted for a period of 23 minutes. The deposited layer was analyzed by ellipsometry and found to be 680 Å thick, with an index of refraction of 1.6.

EXAMPLE 2

The process described in Example 1 was followed except that the monomer was diethylsilane, and the substrate temperature was 50° C. The partial pressure of the diethylsilane at full pumping was 160 millitorr (21 pascals); the partial pressure of the nitrous oxide at full pumping was 100 millitorr (13 pascals). The operating pressure in the deposition chamber was 4 torr (532 pascals). The deposition was allowed to proceed for 26 minutes. Following deposition the substrate was postbaked for one hour at 100° C. The deposited film was analyzed by ellipsometry and found to have a thickness of 440 Å and an index of refraction of 1.66. The deposit appeared to be a viscous liquid or semisolid rather than a hard deposit. This latter property was attributed to the formation of a low molecular weight linear polymer. As previously discussed, mixing of a mono-substituted silane, such as ethylsilane, with the diethylsilane produces a polymer with improved hardness.

EXAMPLE 3

This example illustrates the embodiment of the present invention in which a siloxane coating of graded composition is deposited on a substrate.

The process described in Example 1 is followed except that 3 monomer cylinders are connected by computer controlled flow meters to the photochemical vapor deposition reaction chamber. The monomers used are silane, methyl silane, and dimethyl silane. A fourth flow meter is used to control the nitrous oxide. Initially, silane and nitrous oxide are metered into the deposition chamber until a layer of silicon dioxide 100 Å thick has been deposited. Then, methyl silane is introduced into the reaction chamber in linearly increasing amounts, while the amount of silane is correspondingly decreased, until methyl silane is the only monomer introduced into the deposition chamber. A 500 Å thick layer is deposited during this transition from the silane to the methyl silane monomer. Next, a 500 Å thick layer of polymethylsiloxane is deposited as described herein. Then, the amount of dimethyl silane is gradually increased until it comprises about 50% of the monomer feed, and a total polymer thickness of 5 microns is achieved. The deposited layer comprises a region of silicon dioxide, a region gradually changing in composition from silicon dioxide to polymethylsiloxane, a region of polymethylsiloxane, and a region gradually changing in composition from polymethylsiloxane to a copolymer of methylsiloxane and dimethylsiloxane.

While the present invention has been particularly described with respect to the preferred embodiments thereof, it will be recognized by those skilled in the art that certain modifications in form and detail may be made without departing from the intention and scope of the invention. Such modifications are intended to be included within the scope of the present invention.

What is claimed is:

1. A low-temperature, charge-free process for forming on the surface of a substrate a layer of a siloxane polymer comprising exposing the substrate at 30° C. to 200° C. to a first vapor reactant comprising the monomer precursor having the formula $SiR_xH_{4-x}$ where x is 1 to 4 and R is selected from the group consisting of alkyl and phenyl, and a second vapor phase reactant comprising a chosen oxygen-containing precursor in the presence of radiation of a predetermined wavelength to bring about the formation of neutral atomic oxygen from said second vapor phase reactant and the reaction of said atomic oxygen with said first vapor phase reactant to form said siloxane polymer which deposits on said surface of said substrate in a manner which avoids damage to said substrate due to bombardment by charged particles or radiation or exposure to elevated temperature.

2. The process set forth in claim 1 wherein said oxygen-containing precursor is selected from the group consisting of nitrous oxide, nitrogen dioxide, and molecular oxygen.

3. The process set forth in claim 1 wherein said monomer precursor has the formula $SiRH_3$.

4. The process set forth in claim 3 wherein said monomer precursor is mixed with a compound having the formula $SiR_3H$ and said layer comprises a copolymer.

5. The process set forth in claim 1 wherein said monomer precursor has the formula $SiR_2H_2$.

6. The process set forth in claim 5 wherein said monomer precursor is mixed with a compound having the formula $SiR_3H$ and said layer comprises a copolymer.

7. The process set forth in claim 1 wherein said monomer precursor comprises a mixture of $SiRH_3$ and $SiR_2H_2$ and said layer comprises a copolymer.

8. The process set forth in claim 1 wherein said first vapor phase reactant comprises a mixture of two or more said monomer precursors.

9. The process set forth in claim 1 wherein:
   (a) said oxygen-containing precursor is nitrous oxide;
   (b) said predetermined wavelength of said radiation is 1849 angstroms; and
   (c) said monomer precursor comprises phenylsilane.

10. The process set forth in claim 1 wherein:
    (a) said oxygen-containing precursor is nitrous oxide;
    (b) said predetermined wavelength of said radiation is 1849 angstroms; and
    (c) said monomer precursor comprises a mixture of diethylsilane and ethylsilane.

11. The process of claim 1 wherein said first vapor phase reactant comprises a mixture of two or more said monomer precursors and the proportions of said monomer precursors are altered in a predetermined manner as a function of time to produce corresponding changes in the composition and properties of said siloxane polymer as a function of the thickness of said layer.

12. The process of claim 1 wherein:

(a) said exposing occurs in the presence of mercury vapor as a photosensitizer; and
(b) said radiation is provided by a low pressure mercury vapor lamp.

* * * * *